(12) United States Patent
Choi et al.

(10) Patent No.: US 7,825,994 B2
(45) Date of Patent: *Nov. 2, 2010

(54) DIGITAL TELEVISION TRANSMITTER AND METHOD OF CODING DATA IN DIGITAL TELEVISION TRANSMITTER

(75) Inventors: In Hwan Choi, Gyeonggi-do (KR); Kyung Won Kang, Seoul (KR); Kook Yeon Kwak, Gyeonggi-do (KR); Young Jin Hong, Seoul (KR); Sung Ryong Hong, Gyeonggi-do (KR)

(73) Assignee: LG Electronics, Inc., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/781,735

(22) Filed: May 17, 2010

(65) Prior Publication Data

US 2010/0223652 A1    Sep. 2, 2010

Related U.S. Application Data

(63) Continuation of application No. 11/428,323, filed on Jun. 30, 2006, now Pat. No. 7,764,323.

(30) Foreign Application Priority Data

Oct. 5, 2005    (KR) ..................... 10-2005-0093639

(51) Int. Cl.
*H04N 5/44*    (2006.01)
*H04N 5/455*    (2006.01)

(52) U.S. Cl. ...................................... 348/725; 348/726

(58) Field of Classification Search ......... 348/723–728, 348/611, 612, 21, 614, 607, 608; 375/295, 375/316, 277, 286, 321, 262, 264, 265, 341, 375/346; *H04N 5/44, 5/38, 5/40, 5/455, H04N 5/21*
See application file for complete search history.

(56) References Cited

U.S. PATENT DOCUMENTS

| 7,167,212 B2 * | 1/2007 | Choi et al. .................. 348/724 |
| 2002/0036714 A1 | 3/2002 | Markman |
| 2004/0090997 A1 | 5/2004 | Choi et al. |
| 2007/0076829 A1 | 4/2007 | Choi et al. |

FOREIGN PATENT DOCUMENTS

| KR | 1020030026236 A | 3/2003 |
| MX | PA03005163 A | 9/2003 |
| MX | PA04002568 A | 12/2004 |
| WO | 02/49348 A1 | 6/2002 |
| WO | 03/003747 A1 | 1/2003 |

OTHER PUBLICATIONS

Advanced Televison Systems Committee (ATSC), "ATSC Standard: Digital Television Standard (A/53), Revision D, Including Amendment No. 1," Jul. 27, 2005.

* cited by examiner

*Primary Examiner*—Sherrie Hsia
(74) *Attorney, Agent, or Firm*—Lee, Hong, Degerman, Kang & Waimey

(57) ABSTRACT

A pre-processor pre-processes enhanced data packets by coding the enhanced data packets for forward error correction (FEC) and expanding the FEC-coded data packets. A data formatter adds first null data into first place holders within each pre-processed enhanced data packet. A first multiplexer multiplexes the main data packets with the enhanced data packets having the first null data. A holder inserter inserts second null data into second place holders within an enhanced data packet outputted from the first multiplexer. A data interleaver replaces the second null data with parity data. A data generator generates at least one known data sequence. A symbol processor replaces the first null data included in an output of the data interleaver with the known data sequence(s). A non-systematic RS encoder generates the parity data by performing non-systematic RS-coding on an output of the symbol processor, and provides the parity data to the data interleaver.

8 Claims, 5 Drawing Sheets

FIG. 3

| S mod 52 | Non-systematic RS Parity Place Holders |
|---|---|
| 1 | 48,49,50,51,52,100,101,102,103,104,151,152,153,154,155,156,203,204,205,206 |
| 2 | 49,50,51,52,53,100,101,102,103,104,105,152,153,154,155,156,157,204,205,206 |
| 3 | 49,50,51,52,53,54,101,102,103,104,105,106,153,154,155,156,157,158,205,206 |
| 4 | 3,50,51,52,53,54,55,102,103,104,105,106,107,154,155,156,157,158,159,206 |
| 5 | 3,4,51,52,53,54,55,56,103,104,105,106,107,108,155,156,157,158,159,160 |
| 6 | 3,4,5,53,54,55,56,57,104,105,106,107,108,109,156,157,158,159,160,161 |
| 7 | 3,4,5,6,54,55,56,57,58,106,107,108,109,110,157,158,159,160,161,162 |

DIGITAL TELEVISION TRANSMITTER AND METHOD OF CODING DATA IN DIGITAL TELEVISION TRANSMITTER

This application is a continuation of U.S. application Ser. No. 11/428,323, filed on Jun. 30, 2006 (issued as U.S. Pat. No. 7,764,323 on Jul. 27, 2010), which claims the benefit of and right of priority to Korean Patent Application No. 10-2005-0093639, filed on Oct. 5, 2005, the contents of which are hereby incorporated by reference as if fully set forth herein.

BACKGROUND OF THE INVENTION

1. Field of the Invention

The present invention relates to a digital telecommunications system, and more particularly, to a digital television (DTV) transmitter/receiver and a method of processing data in the DTV transmitter/receiver. Although the present invention is suitable for a wide scope of applications, it is particularly suitable for modulating a digital television signal to a vestigial side band (VSB) mode and transmitting and receiving the VSB modulated digital television signal.

2. Discussion of the Related Art

Since the second half of 1998, the United States of America has adopted an advanced television systems committee (ATSC) 8T-VSB transmission method as the 1995 standard for broadcasting. Presently, the Republic of Korea is also providing broadcast programs by adopting the ATSC 8T-VSB transmission method as the standard for broadcasting. Accordingly, experimental broadcasting began in May 1995, and a test-broadcasting system began on Aug. 31, 2000.

FIG. 1 illustrates a conventional ATSC 8T-VSB transmitting system. A data randomizer randomizes MPEG video/audio data that are inputted. A Reed-Solomon (RS) encoder RS-codes data so as to add a 20-byte parity code. A data interleaver interleaves the data. A trellis encoder converts the data from bytes to symbols and, then, trellis-encodes the converted data. A multiplexer (MUX) multiplexes a symbol column and synchronization signals, and a pilot inserter adds a pilot signal to the symbol column. A VSB modulator converts the symbol column to an 8VSB signal of an intermediate frequency bandwidth. And, a radio frequency (RF) converter converts the VSB-converted signal to an RF bandwidth signal and transmits the RF bandwidth-converted signal to an antenna.

The 8T-VSB transmission mode, which is adopted as the standard for digital broadcasting in North America and the Republic of Korea, is a system that has been developed for the transmission of MPEG video/audio data. However, presently, the technology for processing digital signals is being developed at a vast rate, and, as a larger number of the population uses the Internet, digital electric appliances, computers, and the Internet are being integrated. Therefore, in order to meet with the various requirements of the users, a system that can add video/audio data through a digital television channel so as to transmit diverse supplemental information needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the MPEG video/audio data. However, with the advent of digital broadcasting, ATSC VSB digital television receivers that receive only MPEG video/audio data are already supplied to the market. Therefore, the supplemental data that are transmitted through the same channel as the MPEG video/audio data should not influence the conventional ATSC VSB receivers that are provided in the market. In other words, this may be defined as ATSC VSB compatibility, and the supplemental data broadcast system should be compatible with the ATSC VSB system. Herein, the supplemental data may also be referred to as enhanced data or E-VSB data. Furthermore, in a poor channel environment, the receiving quality of the conventional ATSC VSB receiving system may be deteriorated. More specifically, resistance to changes in channels and noise is more highly required when using portable and/or mobile receivers.

SUMMARY OF THE INVENTION

Accordingly, the present invention is directed to a digital television (DTV) transmitter and a method of coding data in the DTV transmitter that substantially obviate one or more problems due to limitations and disadvantages of the related art.

An object of the present invention is to provide a digital television transmitter that is suitable for transmitting supplemental data and that is highly resistant to noise.

Another object of the present invention is to provide a digital television system that can enhance a decoding function of a supplemental data symbol.

A further object of the present invention is to provide a digital television (DTV) transmitter and a method of coding data in the DTV transmitter that can insert known data sequence in a specific area of the enhanced data and transmitting the data to a transmitter/receiver, thereby enhancing the receiving quality of the digital television system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) transmitter for coding main and enhanced data packets for transmission includes a pre-processor for pre-processing the enhanced data packets by coding the enhanced data packets for forward error correction (FEC) and expanding the FEC-coded data packets, a data formatter for adding first null data into first place holders within each pre-processed enhanced data packet, a first multiplexer for multiplexing the main data packets with the enhanced data packets having the first null data, a holder inserter for inserting second null data into second place holders within an enhanced data packet outputted from the first multiplexer, a data interleaver for replacing the second null data with parity data, a data generator for generating at least one known data sequence, a symbol processor for replacing the first null data included in an output of the data interleaver with the at least one known data sequence, and a non-systematic Reed-Solomon (RS) encoder for generating the parity data by performing non-systematic RS-coding on an output of the symbol processor, and for providing the parity data to the data interleaver.

In another aspect of the present invention, a digital television (DTV) transmitter for coding main and enhanced data packets for transmission includes a pre-processor for pre-processing the enhanced data packets by coding the enhanced data packets for forward error correction (FEC) and expanding the FEC-coded data packets, a data formatter for adding known data sequences into the pre-processed enhanced data packets, a first multiplexer for multiplexing the main data packets with the enhanced data packets having the known data sequence, a holder inserter for inserting null data into place holders within an enhanced data packet outputted from the first multiplexer, a data interleaver for replacing the null data with parity data, a symbol processor for coding enhanced data outputted from the data interleaver, and a non-systematic Reed-Solomon (RS) encoder for generating the parity data by performing non-systematic RS-coding on an output of the symbol processor, and for providing the parity data to the data interleaver.

In another aspect of the present invention, a method of coding main and enhanced data packets in a digital television (DTV) transmitter includes pre-processing the enhanced data packets by coding the enhanced data packets for forward error correction (FEC) and expanding the FEC-coded data packets, adding first null data into first place holders within each pre-processed enhanced data packet, multiplexing the main data packets with the enhanced data packets having the first null data, inserting second null data into second place holders within each enhanced data packet having the first null data, replacing the second null data placed in the second place holders with parity data using a data interleaver, generating at least one known data sequence, replacing the first null data included in an output of the data interleaver with the at least one known data sequence, and generating the parity data by performing non-systematic Reed-Solomon (RS)-coding on the enhanced data packet having the at least one known data sequence, and providing the parity data to the data interleaver.

In another aspect of the present invention, a digital television (DTV) receiver includes a tuner for receiving a DTV signal having main data and enhanced data from a DTV transmitter, the enhanced data being coded for forward error correction (FEC) and expanded by the DTV transmitter, a demodulator for demodulating the DTV signal by performing carrier and timing recovery, an equalizer for correcting channel distortion included in the demodulated DTV signal, a data detector for detecting one or more known data sequences from the enhanced data included in the demodulated DTV signal, wherein the demodulator and the equalizer use the detected known data sequences when performing the carrier and timing recovery and the channel distortion correction, respectively, a Viterbi decoder for Viterbi-decoding main and enhanced data symbols outputted from the equalizer, a data deinterleaver for deinterelaving the Viterbi-decoded data, and a non-systematic Reed-Solomon (RS) parity remover for removing non-systematic RS parity bytes from an enhanced data packet outputted from the data deinterleaver.

In a further aspect of the present invention, a method of decoding a signal in a digital television (DTV) receiver includes receiving a DTV signal having main data and enhanced data from a DTV transmitter, the enhanced data being coded for forward error correction (FEC) and expanded by the DTV transmitter, demodulating the DTV signal by performing carrier and timing recovery, correcting channel distortion included in the demodulated DTV signal, detecting one or more known data sequences from the enhanced data included in the demodulated DTV signal, wherein the demodulation and the channel distortion correction of the DTV signal are performed using the detected known data sequences, Viterbi-decoding main and enhanced data symbols included in the channel-distortion-corrected DTV signal, deinterleaving the Viterbi-decoded data in a deinterleaver, and a non-systematic Reed-Solomon (RS) parity remover for removing non-systematic RS parity bytes from an enhanced data packet outputted from the deinterleaver.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 3 illustrates an example of a non-systematic Reed-Solomon (RS) parity place holder of each segment according to the present invention;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the enhanced data may either consist of data including information such as program execution files, stock information, and so on, or consist of video/audio data. Additionally, the known data refer to data already known based upon a pre-determined agreement between the transmitter and the receiver. Furthermore, the main data consist of data that can be received from the conventional receiving system, wherein the main data include video/audio data.

Figure 1:
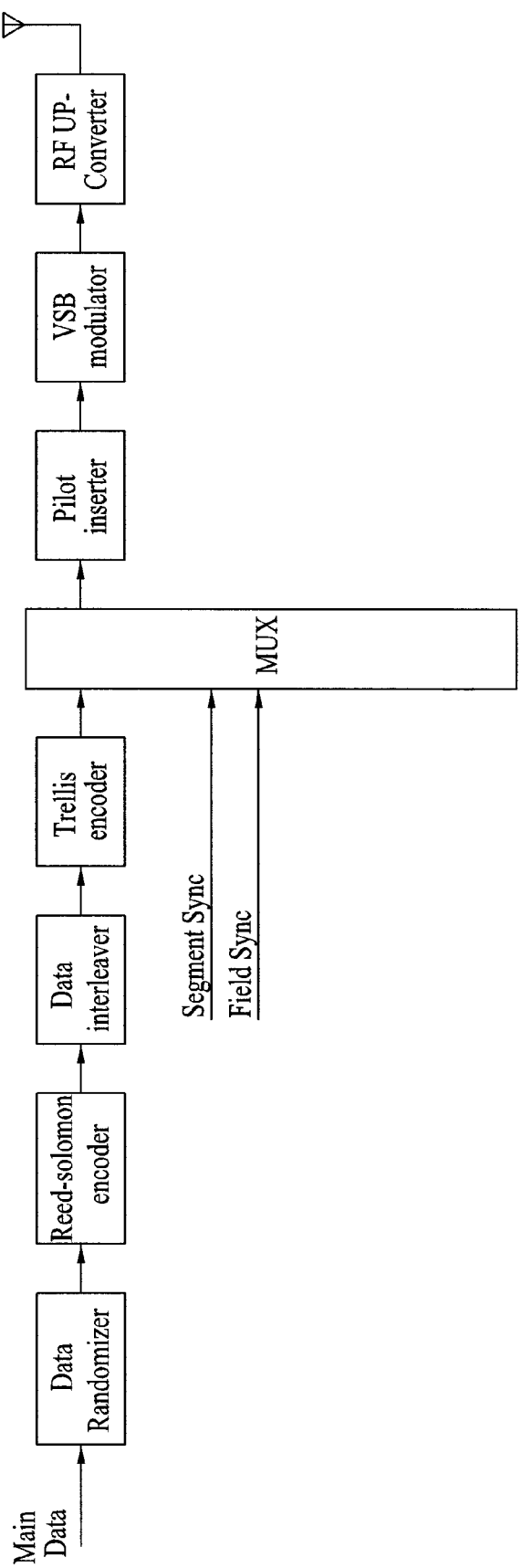
FIG. 1 illustrates a block view of a conventional ATSC 8T-VSB transmitting system.
Figure 2:
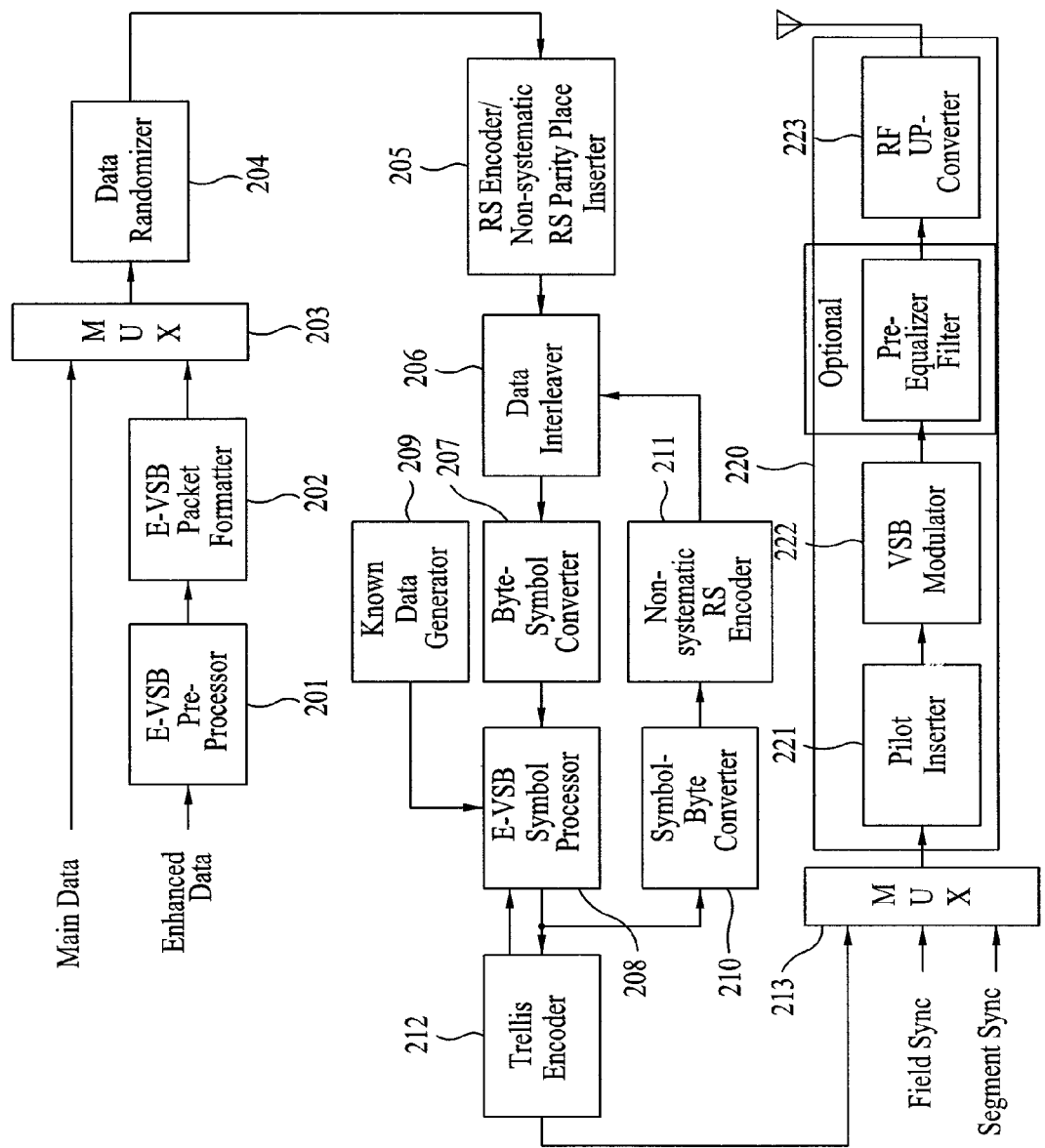
FIG. 2 illustrates an overall block view of a digital television transmitter according to the present invention.

One frame of a general VSB transmission frame is configured of two fields. Each field includes one field synchronization segment and 312 data segments. The present invention relates to inserting known data in a predefined position (or place) within the data segment and transmitting the data, thereby enhancing the receiving performance of the receiver. FIG. 2 illustrates an overall block view of a digital television (DTV) transmitter according to the present invention. The DTV transmitter includes an E-VSB pre-processor 201, an E-VSB packet formatter 202, a packet multiplexer 203, a data randomizer 204, a Reed-Solomon (RS) encoder/parity place holder inserter 205, a data interleaver 206, a byte/symbol converter 207, an E-VSB symbol processor 208, a known data (or sequence) generator 209, a symbol-byte converter 210, a non-systematic encoder 211, a trellis encoder 212, a frame multiplexer 202, a frame multiplexer 213, and a transmitter 220. In the present invention having the above-described structure, a main data is outputted to the packet multiplexer 203, and an enhanced data is outputted to the E-VSB pre-processor 201. The E-VSB pre-processor 201 pre-processes the enhanced data, such as encoding additional error correction, interleaving the data, and inserting null data, and then outputs the pre-processed enhanced data to the E-VSB packet formatter 202.

The E-VSB packet formatter 202 decides a known data place holder in which the known data that is already known within the packet is inserted. Thereafter, the E-VSB packet formatter 202 inserts a null data byte to the decided known data place holder, thereby configuring a packet with the output data of the E-VSB pre-processor 201 in 184-byte units. Subsequently, a 4-byte MPEG header byte is inserted at the beginning of the packet, and then the processed packet is outputted. The MPEG header byte consists of a one MPEG synchronization byte (0x47) and 3 bytes of packet identification (PID). Herein, the PID may use a null packet PID value or a reserved PID value from the conventional ATSC system so as to delete (or discard) the enhanced data packet from the conventional ATSC VSB receiver.

The output data of the E-VSB packet formatter 202 is inputted to the packet multiplexer 203 in 188-byte packet units. The packet multiplexer 203 multiplexes the already existing main data packet with the enhanced data packet of the E-VSB packet formatter 202 in 188-byte units, which are then outputted to the data randomizer 204. The data randomizer 204 discards (or deletes) the MPEG synchronization byte and randomizes the remaining 187 bytes by using a pseudo-random data byte, which is generated from inside the data randomizer 204. Thereafter, the randomized data are outputted to the Reed-Solomon (RS) encoder/parity place holder inserter 205.

The Reed-Solomon (RS) encoder/parity place holder inserter 205 processes the randomized data with either a systematic RS-coding process or a non-systematic parity place holder insertion process. More specifically, when the 187-byte packet that is outputted from the data randomizer 204 corresponds to the main data packet, the Reed-Solomon (RS) encoder/parity place holder inserter 205 performs the same systematic RS-coding as the conventional ATSC VSB system, thereby adding 20-byte parity data at the end of the 187-byte data. Conversely, when the 187-byte packet that is outputted from the data randomizer 204 corresponds to the enhanced data packet, a position (or place) of a parity data byte within the packet is decided so that the 20 parity data bytes are outputted from the output terminal of the data interleaver 206 later than the 187 data bytes. Then, a null data byte is inserted in the decided parity byte position (or place).

Further, the 187 data bytes received from the data randomizer 204 are sequentially inserted in the remaining 187 byte positions.

The null data byte is given an arbitrary value, and such null data byte value is substituted with the parity value calculated by the non-systematic RS encoder 211 in a later process. Accordingly, the role of the null data byte is to ensure the parity byte position (or place) of a non-systematic RS code. The non-systematic RS code is used for the enhanced data packet for the following reason. When the value of the enhanced data is changed by the E-VSB symbol processor 208, which will be described in detail in a later process, the RS parity should be recalculated. And so, the parity bytes should be outputted from the data interleaver 206 output terminal later than the data bytes. For example, when K number of data bytes are received and P number of parity data bytes are added thereto and RS-coded, P number of arbitrary bytes among the total N(=K+P) number of data bytes may be used as the parity data bytes.

The above-described parity place holder of each segment differs from one another, and each parity position (or place) is decided in accordance with Equation 1 below.

$$b=((52 \times p)+(s \bmod 52)) \bmod 207, p=187, 188, \ldots, 206 \quad \text{[Equation 1]}$$

Herein, s represents a segment number after the field synchronization signal, and the value range of s is from 0 to 311. Also, b represents a data byte position (or place) within the corresponding segment, the value of which ranges from 0 to 206. More specifically, s and b respectively indicate the segment and the data byte position (or place) inputted to the data interleaver 206. Furthermore, 52 is an integer set by the data interleaver 206. And finally, mod represents the operation to a module.

Generally, in the ATSC VSB system one transport packet is interleaved by the data interleaver, and the interleaved transport packet is scattered (or dispersed) by a plurality of segments and then outputted. However, since one data segment may transmit one transport packet, a packet before being interleaved may be called as a segment. Therefore, when the position (or place) of the segment is decided, the parity place holder is decided based upon the above-mentioned Equation 1. For example, when using the first segment (i.e., when s=0), by substituting the values ranging from 187 to 206 for p (i.e., when p=187, ..., 206), the parity place holder corresponds to b=202, 47, 99, 151, 203, 48, 100, 152, 204, 49, 101, 153, 205, 50, 102, 154, 206, 51, 103, and 155, respectively.

However, there lies a problem when at least one of the above-stated parity place holders is positioned in the first 3 bytes of the segment. This is because the MPEG transport header including the PID is positioned (or placed) in the first 3 bytes of each segment, wherein each of the segments corresponds to s=1, 2, 3, 4, 5, 6, 7, 53, 54, 55, 56, 57, 58, 59, 105, 106, 107, 108, 109, 110, 111, 157, 158, 159, 160, 161, 162, 163, 209, 210, 211, 212, 213, 214, 215, 261, 262, 263, 264, 265, 266, and 267, respectively. In this case, among the remaining 204 bytes excluding the 3 MPEG header bytes, the 20 latest bytes that are outputted (i.e., the output of the data interleaves) are used as the parity place holder. When transmitting the enhanced data, the MPEG header inserts a null packet PID or a reserved PID. Since this value (i.e., the null packet PID or reserved PID value) is already known, the non-systematic RS-coding may be performed without any problem even when the null packet PID or reserved PID is outputted later than the parity.

Figure 4:
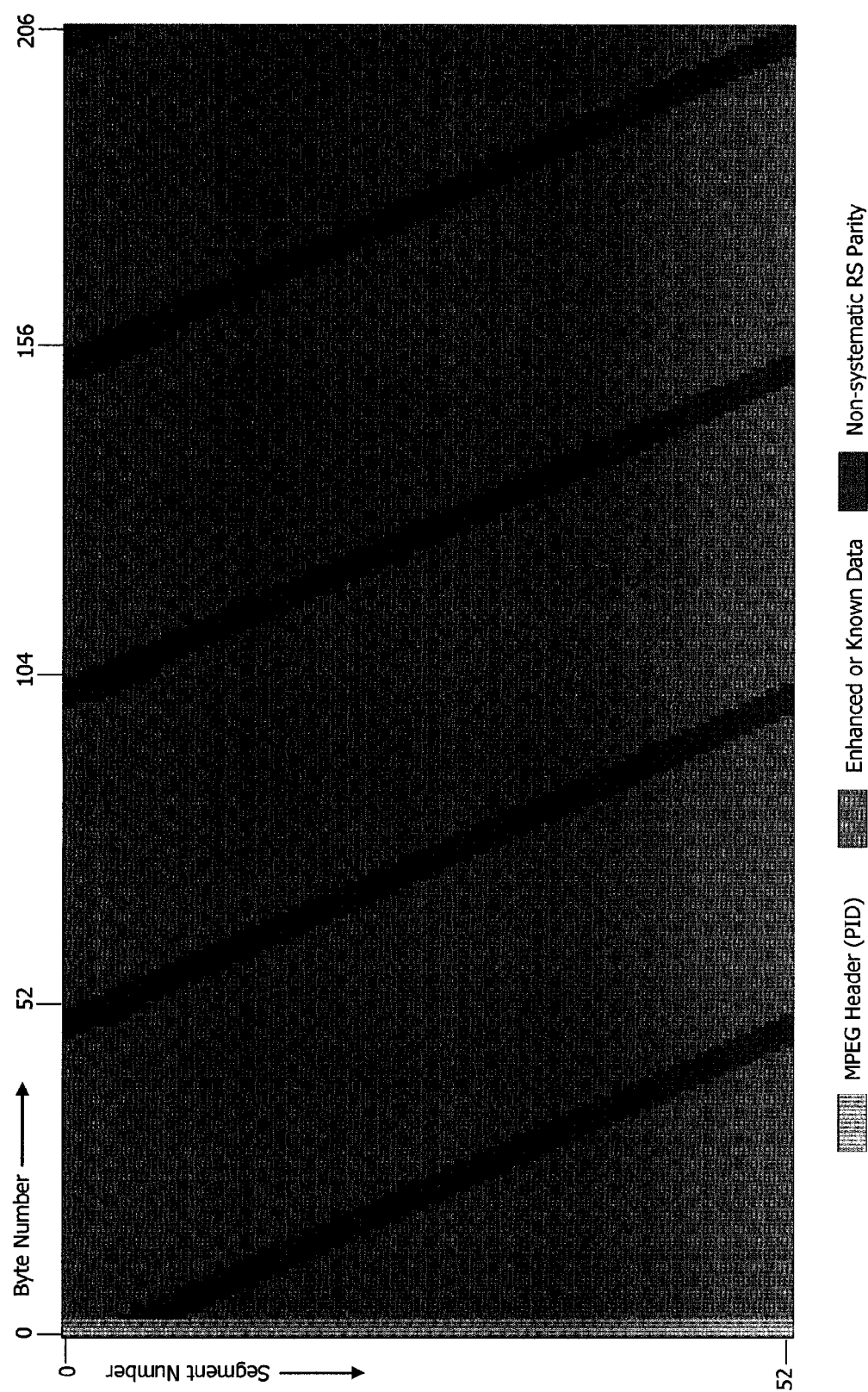
FIG. 4 illustrates an example of a position of a RS parity according to the present invention.

As described above, the position of the parity place holder is repeated in a cycle of 52 segments. More specifically, FIG. 3 shows the data byte numbers of the parity place holder corresponding to s mod 52=1 to s mod 52=7 segment(s). Accordingly, FIG. 4 illustrates the position of the non-systematic RS parity given by Equation 1 and FIG. 3 in accordance with a packet (or segment) number. Herein, FIG. 4 shows a packet format from an input terminal of the data interleaver 206 (or an output terminal of the RS encoder/non-systematic RS parity inserter 205) of the E-VSB transmitting system. Referring to FIG. 4, the MPEG header area corresponds to the 3-byte MPEG header area, the Enhanced or Known data area corresponds to the area in which the enhanced data and/or the known data are to be positioned (or placed). Herein, the non-systematic RS parity bytes of each packet are outputted from the output terminal of the data interleaver 206 later than the enhanced data or known data corresponding to the green area of the same packet.

The output data of the RS encoder/parity place holder inserter 205 are outputted to the data interleaver 206. Then, the data interleaver 206 interleaves and outputs the received data. At this point, the data interleaver 206 receives a RS parity byte that is newly calculated and outputted by the non-systematic RS encoder 211 and, then, substitutes the newly received RS parity byte for the non-systematic systematic RS parity place holder which is not yet outputted. More specifically, the data interleaved 187 information bytes are first outputted. Thereafter, the 20 parity place holders in which a null data byte is respectively inserted are replaced with the newly calculated 20 RS parity bytes and then outputted.

Each data byte outputted from the data interleaver 206 is converted into 4 symbols by the byte-symbol converter 207, which are then outputted to the E-VSB symbol processor 208. Herein, one symbol consists of 2 bits. Additionally, the known data sequence generated (or created) from the known data generator 209 is also outputted to the E-VSB symbol processor 208. The E-VSB symbol processor 208 receives the data outputted from the byte-symbol converter 207 and the known data symbol generated from the known data generator 209, processes the received data with a plurality of processing steps, and then outputs the processed data to the trellis encoder 212 and the symbol-byte converter 210, respectively. More specifically, in case of a main data symbol, the E-VSB symbol processor 208 outputs the received symbol without any change in data. On the other hand, in case of an enhanced data symbol, the received symbol is processed with a signal process that can provide additional coding gain when used in connection with the trellis encoder 212. At this point, when the data that are outputted from the byte-symbol converter 207 correspond to a known data place holder in which null data are inserted, the output data are replaced with the known data generated from the data generator 209, which are then outputted to the trellis encoder 212 and the symbol-byte converter 210.

In the portion where the known data symbol begins, the E-VSB symbol processor 208 generates a data symbol that initializes a memory of the trellis encoder 212 to a predetermined state. Thereafter, the E-VSB symbol processor 20B outputs the generated data symbol instead of the known data symbol having received the generated data symbol for trellis initialization. In order to do so, the value of the memory in the trellis encoder 212 should be provided to the E-VSB symbol processor 208. The trellis encoder 212 is initialized at the beginning of the known data sequence because, even though the known data sequence is inputted as the input of the trellis encoder 212, a plurality of output sequences may be outputted depending upon the memory state of the trellis encoder 212. Therefore, when the known data are inputted after the memory state of the trellis encoder 212 is initialized to a predetermined value, the known data output sequence may be obtained from the output of the trellis encoder 212.

In order to initialize the memory of the trellis encoder 212, 24 input symbols are used in the initializing process, since 12 trellis encoders are included in the VSB transmitting system. More specifically, 12 identical trellis encoders are used in the ATSC VSB system. Therefore, the E-VSB symbol processor 208 should also be provided with 12 identical symbol processors. The trellis encoder 212 pre-codes the data that are inputted as the upper bit among the output symbol of the E-VSB symbol processor 208, and trellis-encodes the data that are inputted as the lower bit. Thereafter, the pre-coded data and the trellis-encoded data are outputted to the frame multiplexer 213.

Meanwhile, the E-VSB symbol processor 208 receives the symbol consisting of 2 bits, processes the received symbol with a plurality of process steps, and outputs the processed symbol. Therefore, the symbol should be converted back to data bytes from the symbol-byte converter 210 so that the non-systematic RS encoder 211 can recalculate the RS parity from the output of the E-VSB symbol processor 208. In other words, the input symbol is converted to byte units from the symbol-byte converter 210 and outputted to the non-systematic RS encoder 211. The non-systematic RS encoder 211 calculates the 20-byte RS parity for the data packet configured of 187 information bytes and outputs the calculated RB parity to the data interleaver 206. The data interleaver 206 receives the RS parity byte calculated and outputted from the non-systematic RS encoder 211 and replaces the non-systematic RS parity place holder that is not yet outputted with the received RS parity byte. Herein, the non-systematic RS-coding is performed so as to prevent a coding error from occurring in the conventional ATSC VSB receiver. More specifically, the coding error occurs because the enhanced data symbol and the known data place holder are each changed to a different value by the E-VSB symbol processor 208. In other words, the non-systematic RS-coding is performed in order to provide the ATSC VSB system with backward-compatibility.

The frame multiplexer 213 inserts 4 segment synchronization symbols in each 828 output symbols of the trellis encoder 212, thereby configuring a data segment having 832 data symbols. More specifically, one field synchronization segment is inserted in each 312 data segments, so as to configure one data field, which is then outputted to the transmitter 220. The transmitter 220 inserts a pilot signal in the output of the frame multiplexer 213, the output having a segment synchronization signal and a field synchronization signal inserted therein. The transmitter 220 then VSB modulates the pilot signal inserted data and converts the VSB modulated data to a radio frequency (RF) signal, which is transmitted through the antenna. Accordingly, the transmitter 220 includes a pilot inserter 221, a VSB modulator 222, and a radio frequency (RF) up-converter 223. Furthermore, a pre-equalizer filter may be optionally included.

As described above, the enhanced data packet according to the present invention includes the enhanced data containing information, and the known data which are included so as to enhance the receiving performance of the receiver. The E-VSB packet formatter 202 multiplexes the output data of the E-VSB pre-processor 201 and the known data place holder, which ensures the place (or position) in which the known data sequence is to be inserted, for the 184 data bytes excluding the 3-byte MPEG header and the 20-byte non-systematic RS parity, thereby configuring one packet. In the enhanced data packet, there is no limitation to the place (or position) in which the known data sequence is inserted and the number of bytes that are to be inserted in the 184-byte area excluding the MPEG header bytes and the non-systematic RS parity bytes. Further, the actual usage of the area may vary in accordance with the usage of the digital television (DTV) transmitter and the method of coding data in the DTV transmitter. Finally, the place to which the output of the known data generator 209 is provided may also vary. More specifically, for example, the E-VSB packet formatter 202 may receive and input the output data of the known data generator 209 instead of a null data byte. Alternatively, the RS encoder/non-systematic parity place holder inserter 205 may receive the known data sequence from the known data generator 209, thereby substituting the received known data sequence for the known data place holder included in the enhanced data packet.

Figure 5:
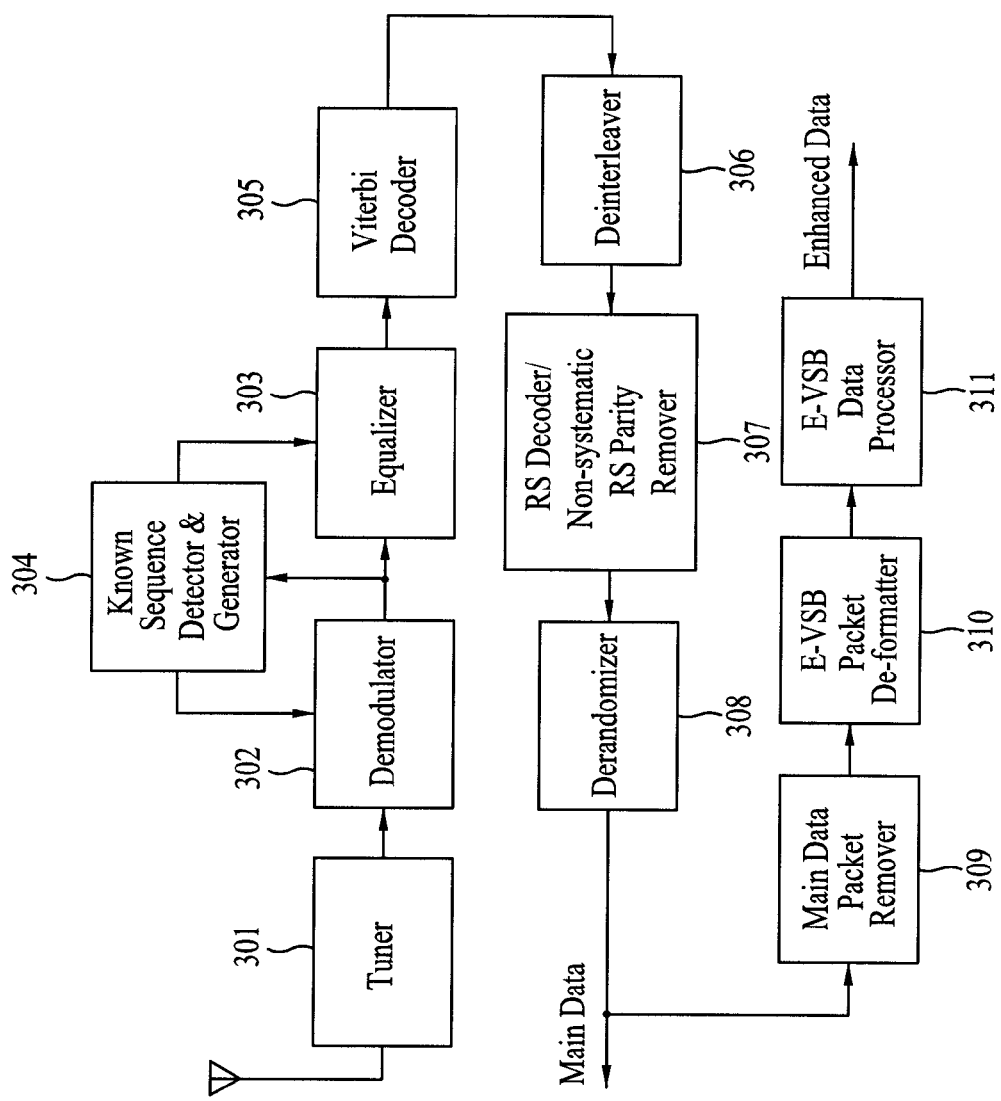
FIG. 5 illustrates a block view showing an overall structure of the digital television receiver according to an embodiment of the present invention.

FIG. 5 illustrates a block view showing an overall structure of the digital television receiver according to an embodiment of the present invention. More specifically, FIG. 5 illustrates an example of a digital television receiver that receives data transmitted from the VSB transmitting system, shown in FIG. 2, and that demodulates and equalizes the received data so as to recover (or restore) the transmitted data. The DTV receiver includes a tuner 301, a demodulator 302, an equalizer 303, a known data (or sequence) detector 304, a Viterbi decoder 305, a deinterleaver 306, a Reed-Solomon (RS) decoder/non-systematic RS parity remover 307, and a derandomizer 308. The DTV receiver also includes a main data packet remover 309, an E-VSB packet deformatter 310, and an E-VSB data processor 311.

The tuner 301 tunes the frequency of a particular channel. Subsequently, the tuner 301 down-converts the tuned frequency and outputs the tuned channel frequency to the demodulator 302. The demodulator 302 demodulates the tuned channel frequency so as to recover carrier frequency and to recover timing frequency, thereby creating a baseband signal. Then, the demodulator 302 outputs the created baseband signal to the equalizer 303 and the known data detector 304. The equalizer 303 compensates for any channel distortion included in the demodulated signal. The equalizer 330 then outputs the processed signal to the Viterbi decoder 305.

At this point, the known data detector 304 detects the known data sequence, which has been inserted by the transmitting end, from the output data of the demodulator 302. Then, the known data detector 304 detects the known data sequence from the output data of the demodulator 302, the detected known data sequence being inserted by the DTV transmitter. Then, the known data detector 304 outputs the detected known data sequence to the demodulator 302 and the equalizer 303. When the demodulator 302 uses the known data during the timing recovery or the carrier recovery, the demodulating performance may be enhanced. Similarly, when the equalizer 303 uses the known data sequence, the equalization performance may be enhanced.

The Viterbi decoder 305 Viterbi-decodes the main data symbol and the enhanced data symbol outputted from the equalizer 303, so as to convert the symbols into data bytes, thereby outputting the newly converted data bytes to the deinterleaver 306. The deinterleaver 306 performs the inverse operation of the data interleaver of the transmitting system and, then, outputs the processed data to the RS decoder/non-systematic RS parity remover 307. If the received packet is the main data packet, the RS decoder/non-systematic RS parity remover 307 RS decodes the received packet. Alternatively, if the received packet is the enhanced data packet, the RS decoder/non-systematic RS parity remover 307 removes the non-systematic RS parity byte from the received packet. Thereafter, the processed packet is outputted to the derandomizer 308. The position (or place) of the non-systematic RS parity is given in Equation 1 and FIG. 3.

The derandomizer 308 performs an inverse process of the randomizer of the DTV transmitter so as to process the output of the RS decoder/non-systematic RS parity remover 307. Subsequently, the derandomizer 308 inserts a MPEG synchronization data byte at the beginning of each packet and output the processed packet in 188-byte units. The output of the derandomizer 308 is outputted to the main MPEG decoder (not shown) and to the main data packet remover 309 at the same time. The main MPEG decoder only decodes the packet corresponding to the main MPEG. More specifically, if the packet ID is a null packet PID or a reserved PID (i.e., an enhanced data packet), then the main MPEG decoder does not perform the decoding process.

In the meantime, the main data packet remover 309 removes the 188-byte unit main data packet from the data outputted from the derandomizer 308 and outputs the processed data to the E-VSB packet deformatter 310. Subsequently, the E-VSB packet deformatter 310 removes (or deletes) the 4-byte MPEG header and the known data place holder byte from the 188-byte packet outputted from the main data packet remover 309. Thereafter, the E-VSB packet deformatter 310 outputs the processed data to the E-VSB data processor 311. The E-VSB data processor 311 performs an inverse process of the E-VSB pre-processor 201 of the transmitting system, so as to process the data outputted from the E-VSB packet deformatter 310. Subsequently, the E-VSB data processor 311 outputs the final output data.

As described above, the digital television (DTV) transmitter and the method of coding data in the DTV transmitter according to the present invention have the following advantages. Herein, the DTV transmitter/receiver is highly protected against (or resistant to) any error that may occur when transmitting enhanced data through a channel, and the DTV transmitter/receiver is also highly compatible to the conventional VSB system. The present invention may also receive the enhanced data without any error even in channels having severe ghost effect and noise. Additionally, by inserting known data sequence in a specific area of the data area and transmitting the processed data, the receiving performance of the DTV receiver liable to a frequent change in channel may be enhanced. Therefore, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of processing a digital broadcast signal in a digital television (DTV) receiver, the method comprising:
    receiving a digital broadcast signal including a data group containing enhanced data, the data group comprising a first segment, a second segment and a third segment, the first segment having parity data at least in 48th, 49th, 50th, 51st and 52nd bytes, the second segment having parity data at least in 49th, 50th, 51st, 52nd and 53rd bytes, and the third segment having parity data at least in 50th, 51st, 52nd, 53rd and 54th bytes; and
    decoding the received digital broadcasting signal, wherein the first segment is prior to the second segment and the second segment is prior to the third segment.

2. The method of claim 1, wherein the first, second and third segments are consecutive.

3. The method of claim 1, wherein the first segment has parity data in 100th, 101st, 102nd, 103rd and 104th bytes.

4. The method of claim 1, wherein each of the first, second and third segments has 207 bytes.

5. A digital television (DTV) receiver comprising:

a tuner for receiving a digital broadcast signal including a data group containing enhanced data, the data group comprising a first segment, a second segment and a third segment, the first segment having parity data at least in 48th, 49th, 50th, 51st and 52nd bytes, the second segment having parity data at least in 49th, 50th, 51st, 52nd and 53rd bytes, and the third segment having parity data at least in 50th, 51st, 52nd, 53rd and 54th bytes; and a decoder for decoding the received digital broadcasting signal, wherein the first segment is prior to the second segment and the second segment is prior to the third segment.

6. The DTV receiver of claim 5, wherein the first, second and third segments are consecutive.

7. The DTV receiver of claim 5, wherein the first segment has parity data in 100th, 101st, 102nd, 103rd and 104th bytes.

8. The DTV receiver of claim 5, wherein each of the first, second and third segments has 207 bytes.

* * * * *